United States Patent
Liu et al.

(10) Patent No.: US 8,093,081 B2
(45) Date of Patent: Jan. 10, 2012

(54) DEVICE OF LIGHT-EMITTING DIODE AND METHOD FOR FABRICATING THE SAME

(75) Inventors: Po-Chun Liu, Taichung County (TW); Chu-Li Chao, Hsinchu (TW); Yih-Der Guo, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 224 days.

(21) Appl. No.: 12/562,145

(22) Filed: Sep. 18, 2009

(65) Prior Publication Data
US 2010/0243987 A1 Sep. 30, 2010

(30) Foreign Application Priority Data
Mar. 30, 2009 (TW) ................ 98110497 A

(51) Int. Cl.
*H01L 21/00* (2006.01)
(52) U.S. Cl. ............... 438/39; 438/42; 438/458
(58) Field of Classification Search ........... 438/39–47, 438/455–459
See application file for complete search history.

(56) References Cited

U.S. PATENT DOCUMENTS 6,071,795 A 6/2000 Cheung et al.
7,491,565 B2 * 2/2009 Coman et al. ............. 438/47
7,501,327 B2 * 3/2009 Kim et al. ............. 438/403
2007/0166862 A1 7/2007 Kim et al.

FOREIGN PATENT DOCUMENTS
CN 1790755 6/2006

OTHER PUBLICATIONS

"First Office Action of China Counterpart Application", issued on Mar. 21, 2011, p. 1-p. 6.

* cited by examiner

*Primary Examiner* — Richard A. Booth
(74) *Attorney, Agent, or Firm* — Jianq Chyun IP Office

(57) ABSTRACT

A device of a light-emitting diode and a method for fabricating the same are provided. The LED device is made by forming a patterned epitaxial layer, a light-emitting structure, etc., on a substrate. In a subsequent process, the patterned epitaxial layer serves as a weakened structure, and can be automatically broken and a rough surface is thus formed. The weakened structure is formed with a specified height, and has pillar structures. The light-emitting structure is formed on the weakened structure. During a cooling process at room temperature, the weakened structure is automatically broken and a rough surface is thus formed.

10 Claims, 11 Drawing Sheets

DEVICE OF LIGHT-EMITTING DIODE AND METHOD FOR FABRICATING THE SAME

CROSS-REFERENCE TO RELATED APPLICATION

This application claims the priority benefit of Taiwan application serial no. 98110497, filed Mar. 30, 2009. The entirety of the above-mentioned patent application is hereby incorporated by reference herein and made a part of specification.

BACKGROUND OF THE INVENTION

1. Field of the Invention

The present invention relates to a device of a light-emitting diode, and a method for fabricating the same. More particularly, the present invention relates to a device of a light-emitting diode using a weakened structure for being separated from a substrate, and a method for fabricating the same.

2. Description of Related Art

There are horizontal structures and vertical structures for Light-emitting diodes (LED) in application. For a conventional horizontal LED device, since electrodes are disposed at a same side, there may have a current crowding phenomenon at a mesa portion of the LED device, which can lead to a poor heat dissipation effect, and accordingly limit an amount of a driving current that the LED can sustain. Presently, the vertical structure is generally adopted for a high power LED.

As shown in FIG. 1A, after a LED device 102 and a mirror/adhesive layer 104 are grown on an epitaxial substrate 100, the LED device 102 is transferred to a carrier substrate 108 through the adhesive layer 104 according to a wafer bonding method. Next, as shown in FIG. 1B, the epitaxial substrate 100 is removed. Next, in FIG. 1C, metal electrodes 110 are respectively formed on a surface of the LED device 102 and a surface of the carrier substrate 108, so as to form the vertical structure. As shown in FIG. 1C, due to a configuration the vertical electrodes, the distribution of current I is better. Moreover, since the carrier substrate 108 is generally formed by a material with a good conductivity and a better heat dissipation effect, such as silicon, copper, aluminium, copper/tungsten, etc., an operation efficiency of the LED device can be improved.

However, a present method for separating the epitaxial substrate is a laser lift-off (LLO) method disclosed by the U.S. Pat. No. 6,071,795. A KrF laser is used to irradiate an interface between the substrate and a gallium nitride layer from the side of the epitaxial substrate, so as to be separated from the epitaxial substrate after the interface absorbs sufficient energy. The epitaxial substrate can be directly removed by a grinding method. In addition, a wet etching process is used together with the grinding method, by which the substrate is grinded thinner, and then an etching solution is used to dissolve the remained substrate. However, when using the LLO method, since it is not easy to control the laser energy, the device surface is liable to be damaged. For a fragile substrate, such as a gallium arsenide substrate, the grinding method is not applicable. Though, for a substrate fainted by a relatively hard material, such as sapphire, gallium nitride, aluminium nitride, etc., it may take a rather long time to perform the grinding. Moreover, in case of the method of grinding and then wet etching, the method is only applicable to the gallium arsenide substrate or a silicon substrate, and is not applicable to the gallium nitride substrate, the aluminium nitride substrate, or the sapphire substrate.

SUMMARY OF THE INVENTION

The present invention is directed to a device of a light-emitting diode (LED), and a method for fabricating the same, by which a LED device can be separated from an epitaxial substrate.

In one embodiment, a method for fabricating a LED device is provided, and the method comprises at least the following steps. First, a substrate is provided. Next, a patterned epitaxial layer is fainted on the substrate, wherein the patterned epitaxial layer has a specific height and is fanned by a plurality of pillar structures. Next, a mask layer is formed on a surface of the patterned epitaxial layer, and the mask layer at least covers a sidewall of the patterned epitaxial layer. Next, a nitride epitaxial layer is fanned on the patterned epitaxial layer. Next, a light-emitting structure layer is formed on the nitride epitaxial layer to complete a first structure. Next, a conductive carrier substrate is provided, and a bonding process is performed to transfer the first structure to the conductive carrier substrate. Next, a weakening process is performed with a cooling process, so as to break the patterned epitaxial layer to form a LED structure including a plurality of irregular pillar structures, and the mask layer covers a surface of the pillar structures.

In one embodiment, a LED device is provided, comprising a conductive carrier substrate, a light-emitting structure, a plurality of pillar structures, a dielectric layer, a first electrode and a second electrode. The light-emitting structure is located on the conductive carrier substrate. The pillar structures are located on the light-emitting structure. The dielectric layer covers a surface of the pillar structures. The first electrode is located on the pillar structure, and the second electrode is located on the conductive carrier.

In summary, by using the weakened structure, during a cooling process the LED device can be naturally separated from the epitaxial substrate due to the difference of expansion coefficients of different materials, so that no additional process, such as laser lift-off (LLO), is required. Moreover, the LED device has the epitaxial layer with a specific thickness, so that the LED device can be naturally separated from the epitaxial substrate, and cracking of the LED device can be avoided.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A-2M are schematic diagrams illustrating a fabricating process of a LED device according to an embodiment of the present invention.

DESCRIPTION OF EMBODIMENTS

FIGS. 2A-2M are schematic diagrams illustrating a fabricating process of a LED device according to an embodiment of the present invention. Layers of the LED device are drawn for clarity of relative positions and are not necessarily drawn to scale. Moreover, materials of the layers mentioned in the present embodiment are only used for description, which can be suitably modified by those skilled in the art.

Figure 1A:
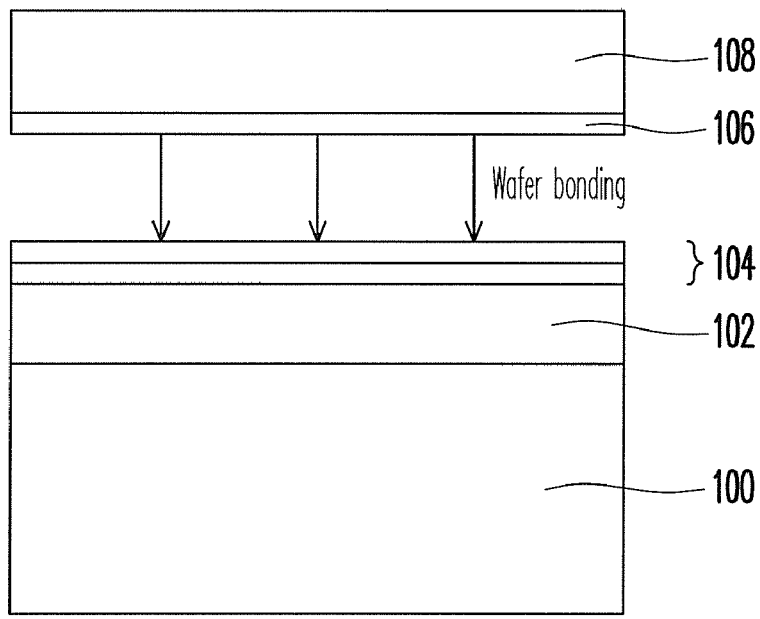
FIGS. 1A-1C are diagrams illustrating a conventional LED structure and a fabrication process thereof.
Figure 1B:
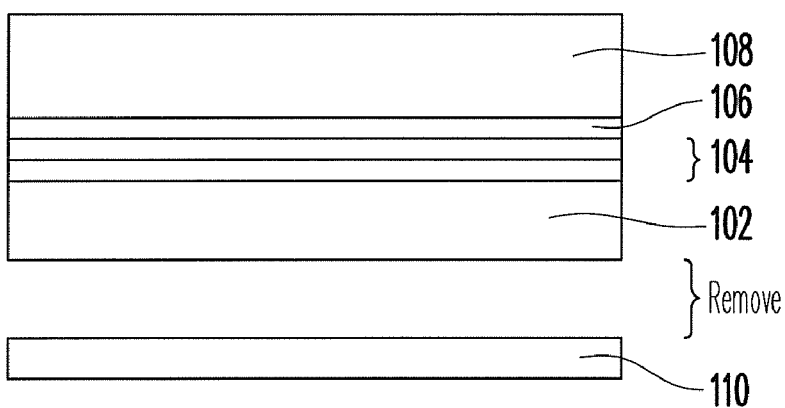
Figure 1C:
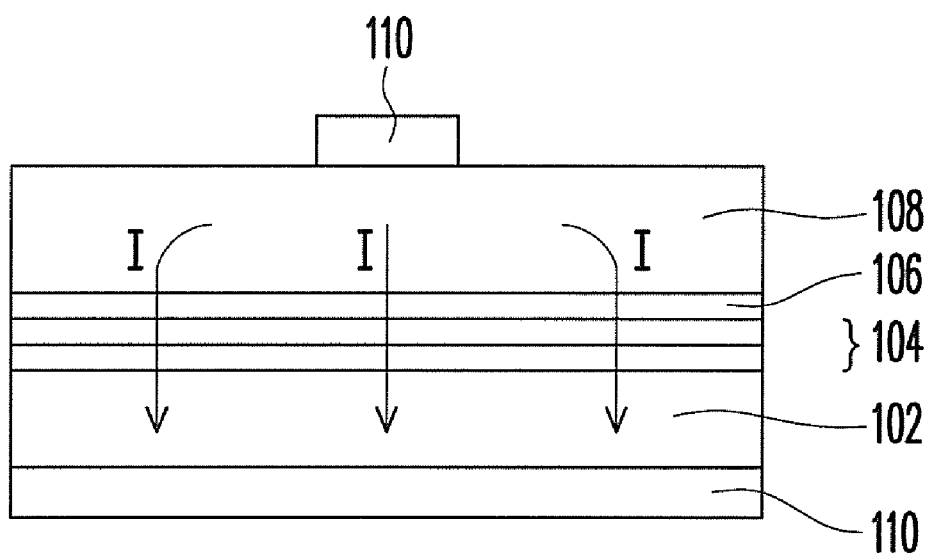
Figure 2A:
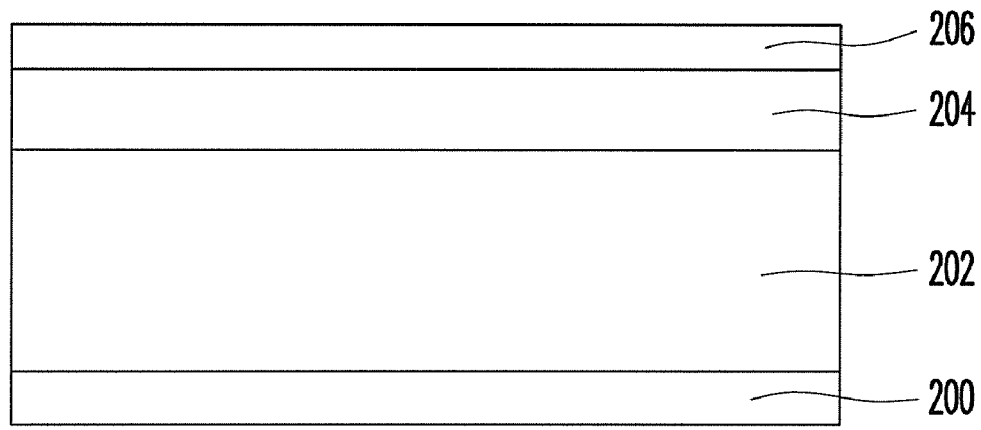

As shown in FIG. 2A, an epitaxial layer 202, a first mask layer 204 and a second mask layer 206 are sequentially formed on a substrate 200. The epitaxial layer 202 is used to form a weakened structure of the present embodiment in a subsequent fabrication process. A material of the substrate 200 is, for example, sapphire, gallium nitride, silicon, silicon carbide, gallium arsenide, gallium phosphide, zinc oxide, or magnesium oxide, etc. In the present embodiment, a sapphire substrate is taken as an example.

Moreover, in the present embodiment, a material of the epitaxial layer 202 is gallium nitride, though such material is only used as an example and not for limiting the present invention. When a different light-emitting diode (LED) structure is used, the material can be suitably changed. For an exemplary description, the epitaxial layer 202 is referred to as a gallium nitride layer 202 in the following descriptions. Moreover, a thickness of the gallium nitride layer 202 is, for example, 0.5-3 nm.

In addition, a material of the first mask layer 204 is, for example, silicon dioxide, and a thickness thereof is, for example, 200 nm. A material of the second mask layer 206 is, for example, nickel, and a thickness thereof is about 50-300 nm. The first mask layer 204 and the second mask layer 206 can be used as etching masks in a subsequent fabrication process. The materials of the first mask layer 204 and the second mask layer 206 can be suitably changed according to different etching recipes, etc.

Figure 2B:
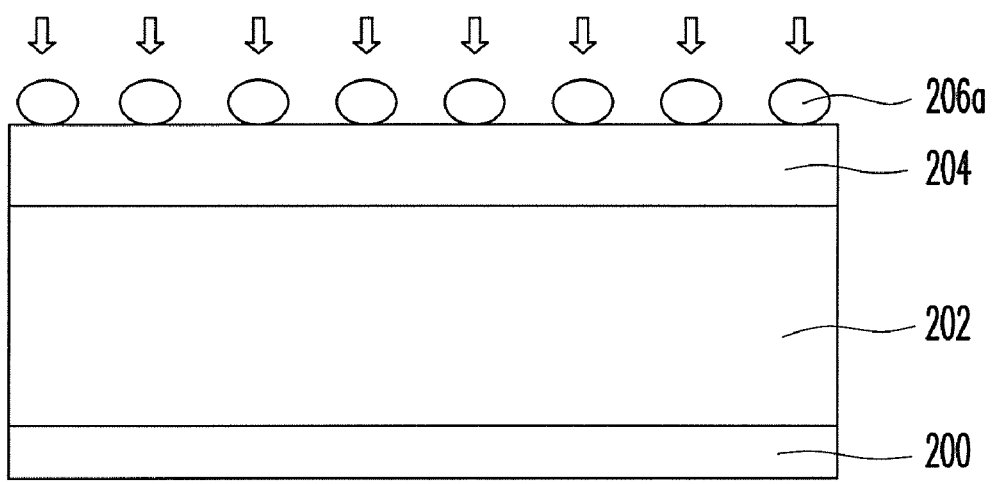

Next, as shown in FIG. 2B, a high-temperature process is performed to the above assembly, and such high-temperature process is, for example, a tempering process with a temperature of 650-950° C. By such high-temperature process, the second mask layer 206 on the first mask layer 204 can be converted into a mask sphere layer 206a due to surface tension. The mask sphere layer 206a comprises a number of mask spheres. In the present embodiment, the mask sphere layer 206a is, for example, a nickel nano mask sphere layer whose size can be an order of nanometer. A diameter of each of the mask spheres is, for example, between 50-350 nm, and a pitch between two mask spheres is, for example, 100-350 nm. The mask spheres can be arranged in a random pattern or a regular pattern.

Figure 2C:
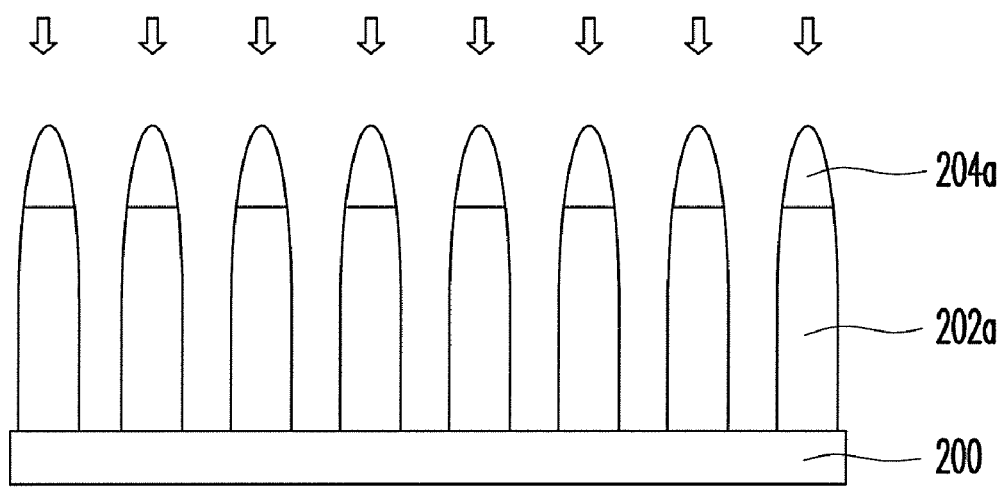
Figure 2D:
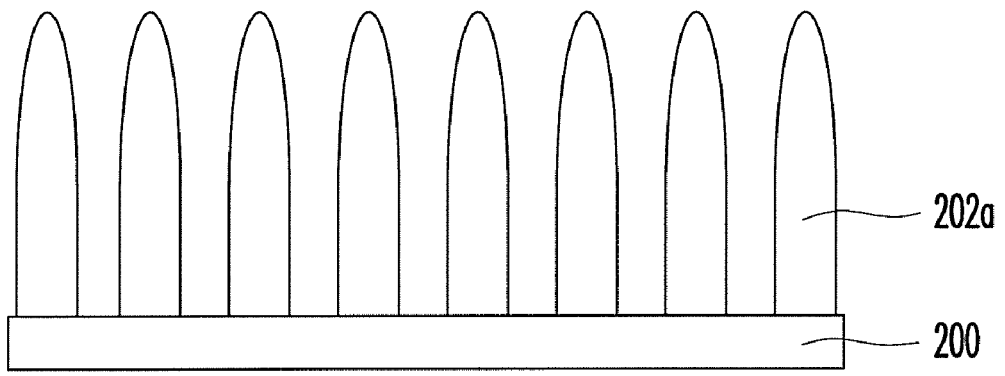

Next, as shown in FIGS. 2B and 2C, using the etching method, the first mask layer 204 and the gallium nitride layer 202 are etched to expose the substrate 200 taking the mask sphere layer 206a as a mask, so as to form a patterned epitaxial layer 202a. Since the mask sphere layer 206a has the size of nanometer order, a gallium nitride pillar layer with the size order of nanometer can be formed under a controlled condition that a vertical etching rate is greater than a lateral etching rate. The gallium nitride pillar layer is then referred to as a gallium nitride pillar layer 202a. Referring to FIG. 2D, the remained mask spheres 206a and the first mask layer 204a are removed, and a removing method thereof can be performed by using on any semiconductor etching process.

The gallium nitride pillar layer 202a serves as a weakened structure in the subsequent fabrication process to facilitate a subsequent weakening process. A width of each of the pillars is, for example, between 50-350 nm, a pitch between two pillars is, for example, 100-350 nm, and a height of the pillar is 0.5-3 μm. The pillars can be regularly or irregularly arranged, which is determined by an etched pattern of the second mask layer.

Figure 2E:
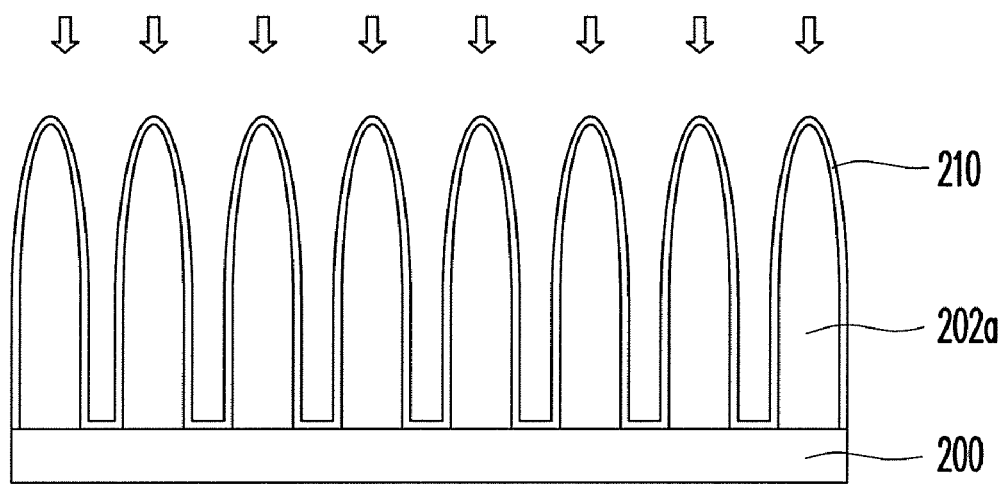

Next, referring to FIG. 2E, a third mask layer 210 is conformally deposited on a surface of the gallium nitride pillar layer 202a. The third mask layer 210 can be used as a passivation layer in the subsequent fabrication process. A material of the third mask layer 210 is, for example, silicon dioxide ($SiO_2$), and a thickness thereof is, for example, 50-200 nm.

Figure 2F:
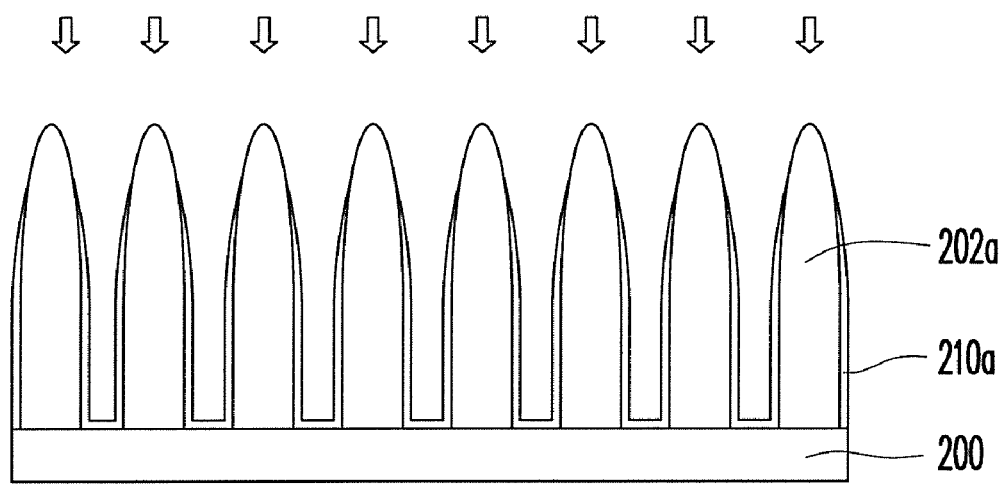

Referring to FIG. 2F, the third mask layer 210 on the top of the gallium nitride pillar layer 202a is selectively etched to expose a part of top surface 204a of the gallium nitride pillar layer 202a, so as to form a fourth mask layer 210a. The etching method thereof can be a suitable semiconductor etching process, such that only the third mask layer 210 around the top of the gallium nitride pillar layer 202a is removed during the etching process.

Figure 2G:
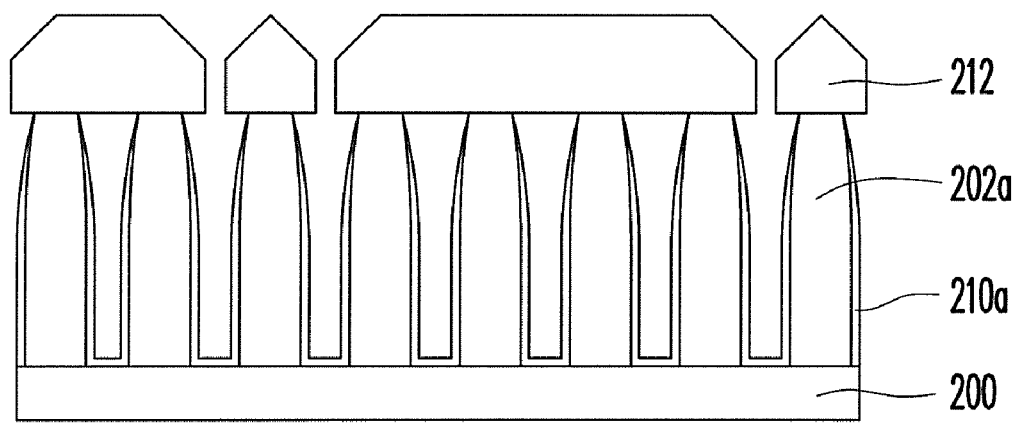
Figure 2H:
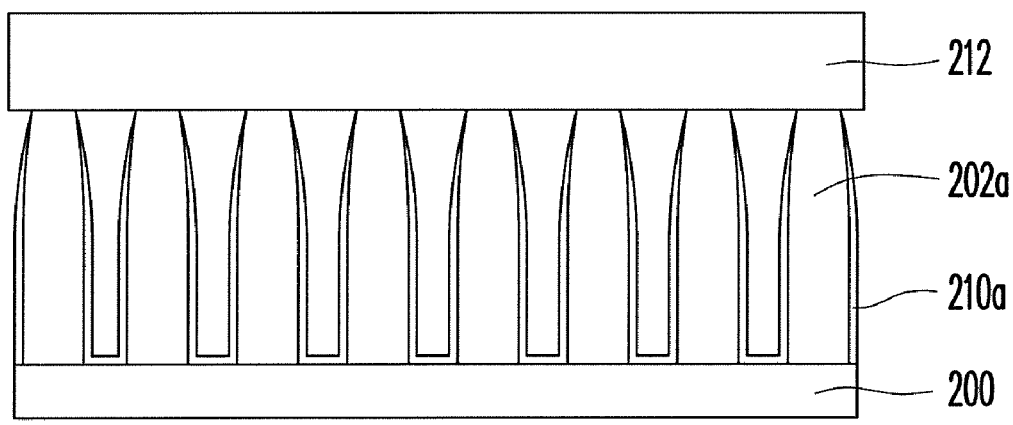
Figure 21:
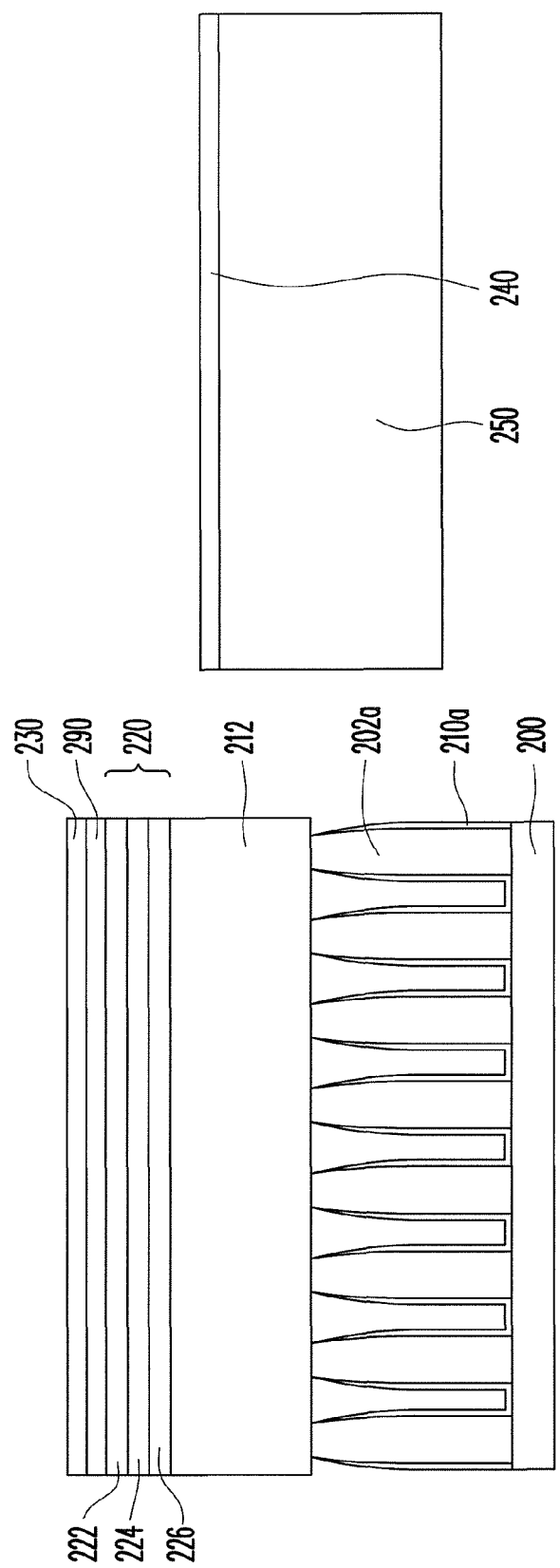

Next, as shown in FIGS. 2G and 2H, by using a metal organic chemical vapor deposition (MOCVD) method, a nitride epitaxial layer 212 is grown on the exposed surface of the gallium nitride pillar layer 202a according to a lateral epitaxial growth technique. The nitride epitaxial layer 212 is, for example, an N-type doped gallium nitride epitaxial layer.

Moreover, considering a lattice mismatch, a stress factor between the LED device and the substrate, and a stress factor that causes cracking of the epitaxial device during a subsequent cooling process, the nitride epitaxial layer 212 has a specific thickness range, for example, 0.5-3 μm, so as to minimize an influence of the lattice mismatch during the growth, and avoid the epitaxial layer from cracking.

Next, as shown in FIG. 2I, a semiconductor stack layer 220 is formed on the surface of the nitride epitaxial layer 212, and the semiconductor stack layer 220 is a stacked structure formed by, for example a first doped layer, a light-emitting layer and a second doped layer. In the present embodiment, the semiconductor stack layer 220 is, for example, formed by an N-type doped gallium nitride layer 222, a quantum well (QW) or a multiple quantum well (MQW) 224 and a P-type doped gallium nitride layer 226.

Next, a conductive reflection layer 290 and a first bonding layer 230 are formed above the semiconductor stack layer 220, so as to form a LED structure shown at the left side of FIG. 2I. Also referring to FIG. 2I, another conductive carrier substrate 250 is provided, and the conductive carrier substrate 250 can be formed by silicon, for example. A second bonding layer 240 is formed on a surface of the conductive carrier substrate 250.

Next, a wafer bonding process is performed, by which the aforementioned two structures are mutually bonded through the first bonding layer 230 and the second bonding layer 240. With bonding process, the semiconductor stack layer 220 and the sapphire substrate 200 are adhered to the conductive carrier substrate 250 to form a structure A shown in FIG. 2J, and the structure A includes a light-emitting structure A1, the gallium nitride pillar layer 202a and the substrate 200. The material of the first bonding layer 230 and the second bonding layer 240 is, for example, gold tin (AuSn) alloy or gold, which can be used for the wafer bonding process. The reflection layer and the conductive material thereof can be alloy materials of nickel, platinum and aluminium, etc. Therefore, the structure is not limited to be a single layer material, but multiple layers can also be formed according to actual requirements, which are known by those skilled in the art. The aforementioned embodiment is only used as an example, and not for limiting the present invention.

Moreover, during the above fabrication process, since the epitaxial process and the wafer bonding process for forming the semiconductor stack layer 220 are performed on different machines, a cooling process is performed during a machine transfer process. As described above, the thicker gallium nitride layer 212 can endure a thermal expansion coefficient difference of the sapphire substrate 200, the gallium nitride layer 212 and the semiconductor layer 220, so as to avoid the cracking of the device due to an uneven stress distribution caused by the temperature difference during the cooling process.

Figure 2J:
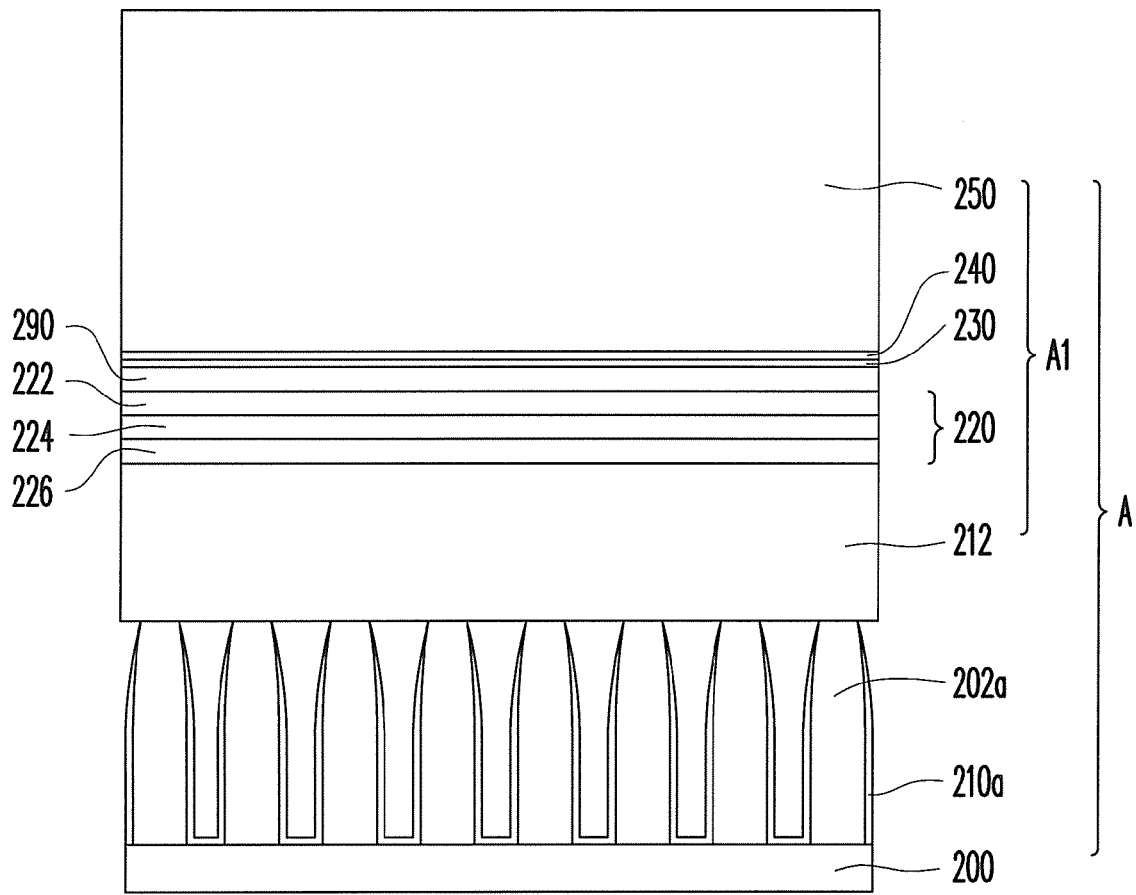
Figure 2K:
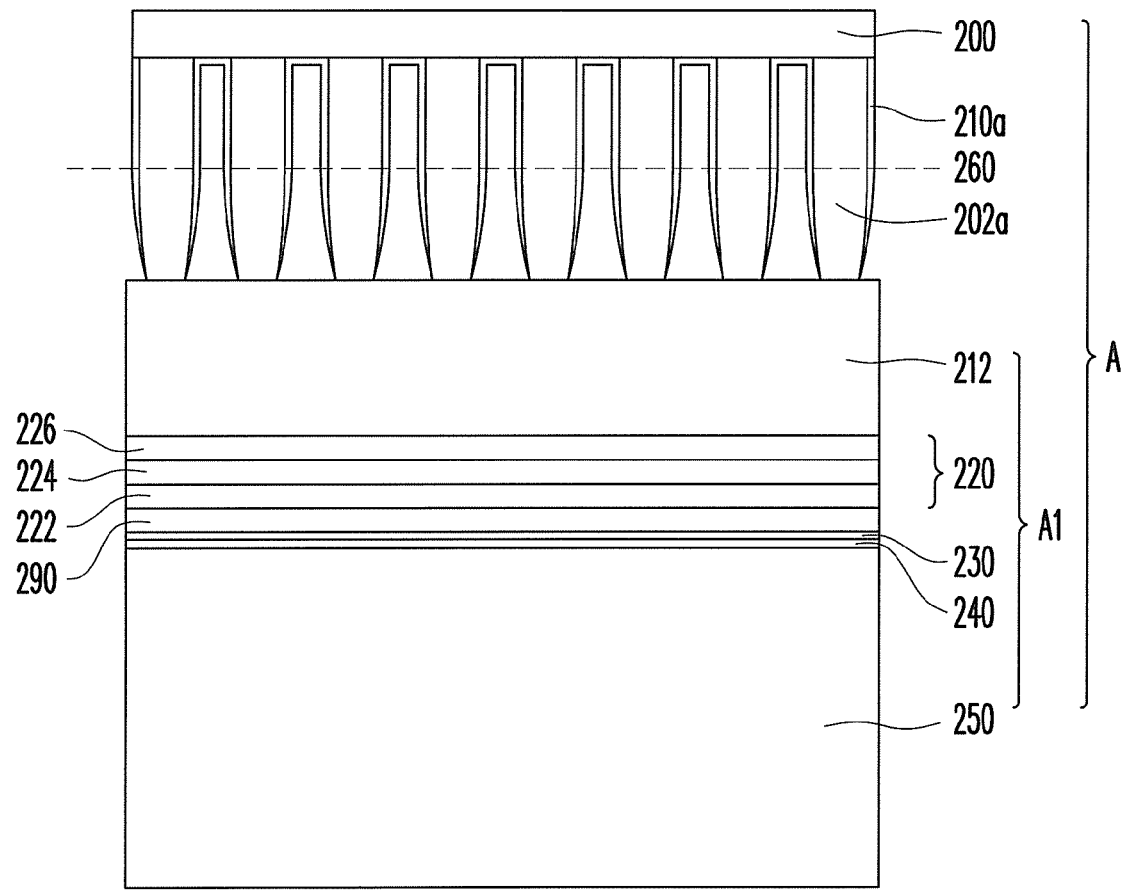

Next, referring to FIG. 2K, after the wafer bonding is completed, the cooling process is again performed to the structure A shown in FIG. 2J, which is also referred to as the weakening process of the present invention. Such cooling process is, for example, to gradually cool the bonded structure A to an environmental temperature, i.e., about a room temperature. Similarly, since the thermal expansion coefficients of the substrate 200 and the carrier 210 are different, when the temperature is decreased from a wafer bonding temperature (i.e., 350-450° C., taking a gold/tin bonding surface as an example) to 28° C. within 60 minutes, the stress among materials can cause a natural break of a weakest interface (i.e., an interface 260 in the middle of the gallium nitride pillar layer 202a) in the light-emitting structure A1 of the structure A, so as to form a plurality of irregular pillar structures with sidewalls covered by the fourth mask layer 210a.

Figure 2L:
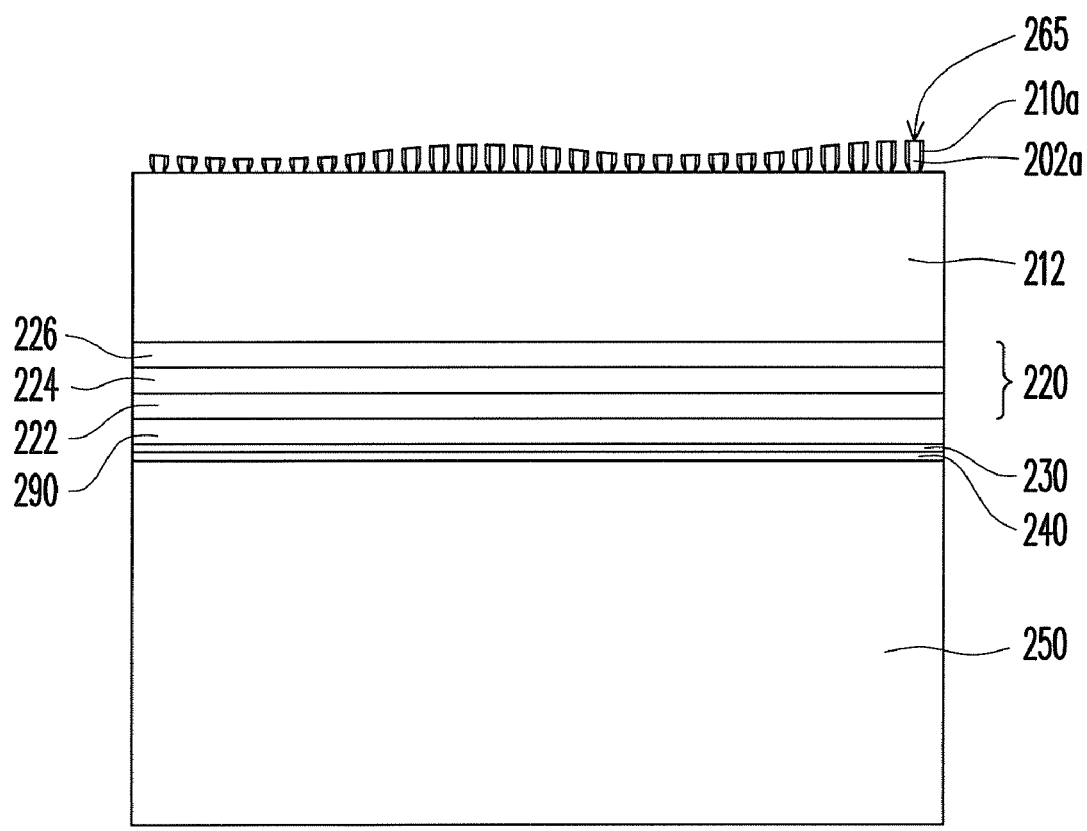

Moreover, a broken surface of the interface 260 is unnecessarily to be an even surface. As shown in FIG. 2L, a broken interface surface 265 is only one pattern of the broken surface of the interface 260, which is not used for limiting the present invention. Moreover, the broken interface surface 265 is formed on the surface of the light-emitting structure A1, so that a light-emitting efficiency can be improved by spoiling a full reflection angle during the light-emitting process. Therefore, without performing an extra fabrication process, the LED can be separated from the substrate 200, and the light-emitting efficiency can be improved.

Figure 2M:
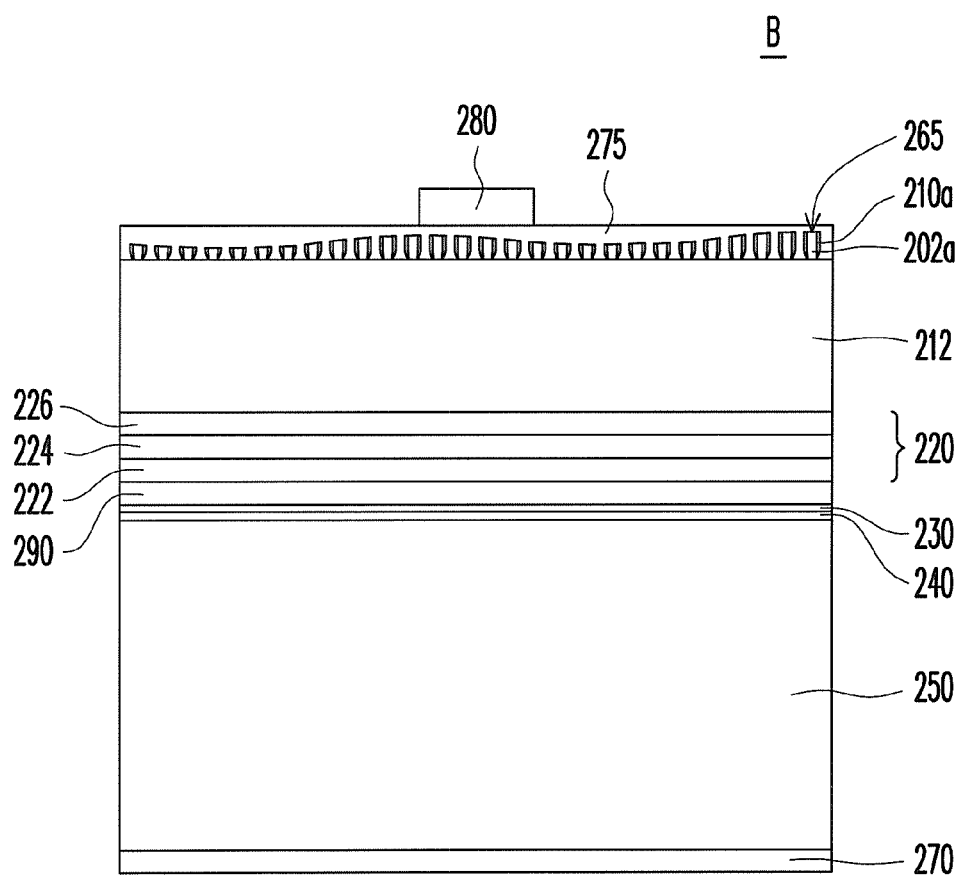

Finally, as shown in FIG. 2M, a N-type electrode 280 is formed on a suitable position of the device surface, and a P-type electrode 270 is formed on the surface of the silicon conductive carrier substrate 250, so as to form a LED device B. For example, the electrodes can be configured at suitable positions on the conductive carrier substrate 250 and the broken surface of the gallium nitride pillar layer 202a. In addition, a conductive transparent Layer 275 can be further formed to cover the broken interface surface 265. Then, the N-type electrode 280 is formed on the conductive transparent Layer 275.

In the LED device of the present embodiment, the gallium nitride material is taken as an example, though other suitable light-emitting materials and epitaxial substrates can also be applied. For example, a gallium arsenide substrate can be used to grow an aluminium gallium indium phosphide (AlGaInP), or a silicon substrate is used to grow the gallium nitride. Therefore, in an actual application, the present invention is not limited to use the gallium nitride substrate or the sapphire substrate.

In summary, with the weakened structure, during a cooling process, the light-emitting structure can be automatically separated from the epitaxial substrate due to the difference of expansion coefficients of different materials, so that no additional process, such as laser lift-off (LLO), is required. Moreover, the light-emitting structure has the epitaxial layer with a specific thickness, so that cracking of the device due to uneven stress distribution caused by the thermal expansion coefficient difference of the substrate and the semiconductor stack layer, etc., during the cooling process can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a LED device, comprising:
   providing a substrate;
   forming a patterned epitaxial layer on the substrate, wherein the patterned epitaxial layer is formed by a plurality of pillar structures;
   forming a mask layer on a surface of the patterned epitaxial layer, wherein the mask layer at least covers a sidewall of the patterned epitaxial layer;
   forming a nitride epitaxial layer on the patterned epitaxial layer;
   forming a light-emitting structure layer on the nitride epitaxial layer to complete a first structure;
   providing a conductive carrier substrate, and performing a bonding process to transfer the first structure to the conductive carrier substrate; and
   performing a weakening process with a cooling process, so as to break the patterned epitaxial layer.

2. The method for fabricating a LED device as claimed in claim 1, wherein steps of forming the patterned epitaxial layer further comprise:
   forming an epitaxial layer on the substrate;
   forming a first mask layer on the epitaxial layer;
   forming a second mask layer on the first mask layer;
   performing a high-temperature process so that the second mask layer forms a mask sphere layer, wherein the mask sphere layer comprises a plurality of mask spheres; and
   removing a portion of the first mask layer and the epitaxial layer to form the patterned epitaxial layer using the mask sphere layer as a mask.

3. The method for fabricating a LED device as claimed in claim 2, wherein a diameter of each of the mask spheres in the mask sphere layer is 50-350 nm, and a pitch between the mask spheres is 100-350 nm.

4. The method for fabricating a LED device as claimed in claim 1, wherein each of the pillar structures has a specific height of 0.5-3 μm, a width of each of the pillar structures is 50-350 nm, and a pitch between the pillar structures is 100-350 nm.

5. The method for fabricating a LED device as claimed in claim 1, wherein steps of forming the epitaxial layer further comprise:
   conformally forming a third mask on the patterned epitaxial layer; and
   removing a portion of the third mask layer on top of the patterned epitaxial layer.

6. The method for fabricating a LED device as claimed in claim 1, wherein a thickness of the nitride epitaxial layer is 0.5-3 μm.

7. The method for fabricating a LED device as claimed in claim 1, wherein a step of forming the light-emitting structure comprises sequentially forming a first doped layer, a light-emitting layer and a second doped layer, wherein conductivities of the first and the second doped layers are different, and the light-emitting layer is a QW layer or a MQW layer.

8. The method for fabricating a LED device as claimed in claim 1, further comprising:
   forming a first bonding layer on the light-emitting structure layer;
   forming a second bonding layer on the conductive carrier; and completing the bonding process through the first and the second bonding layers.

9. The method for fabricating a LED device as claimed in claim 1, further comprising respectively forming a first and a second electrodes on the conductive carrier substrate and a surface of a weakened structure, wherein the conductivities of the first electrode and the second electrode are different.

10. The method for fabricating a LED device as claimed in claim 1, wherein thermal expansion coefficients of the conductive carrier substrate, and the patterned epitaxial layer or the light-emitting structure are different.

* * * * *